United States Patent
Satou

(10) Patent No.: US 10,680,558 B2
(45) Date of Patent: Jun. 9, 2020

(54) POWER AMPLIFIER CIRCUIT

(71) Applicant: Murata Manufacturing Co., Ltd., Kyoto (JP)

(72) Inventor: Hideyuki Satou, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 43 days.

(21) Appl. No.: 16/185,394

(22) Filed: Nov. 9, 2018

(65) Prior Publication Data
US 2019/0149095 A1    May 16, 2019

(30) Foreign Application Priority Data
Nov. 10, 2017    (JP) .................... 2017-217476

(51) Int. Cl.
| | |
|---|---|
| H03F 3/04 | (2006.01) |
| H03F 1/02 | (2006.01) |
| H03F 3/213 | (2006.01) |
| H03F 3/195 | (2006.01) |
| H03F 3/24 | (2006.01) |

(52) U.S. Cl.
CPC ......... *H03F 1/0216* (2013.01); *H03F 1/0261* (2013.01); *H03F 3/195* (2013.01); *H03F 3/213* (2013.01); *H03F 3/245* (2013.01); *H03F 2200/102* (2013.01); *H03F 2200/21* (2013.01); *H03F 2200/451* (2013.01)

(58) Field of Classification Search
CPC .... H03F 1/0216; H03F 1/302; H03F 2200/18; H03F 1/301; H03F 1/0261; H03F 3/245; H03F 3/213; H03F 3/195; H03F 2200/102; H03F 2200/451; H03F 2200/21; H03G 3/3042; H03G 3/3047
USPC .................................................. 330/285, 296
See application file for complete search history.

(56) References Cited

U.S. PATENT DOCUMENTS

| | | | | |
|---|---|---|---|---|
| 9,369,090 | B2* | 6/2016 | Kusachi | H03F 1/52 |
| 9,525,389 | B2* | 12/2016 | Hirooka | H03F 1/0261 |
| 9,787,271 | B2* | 10/2017 | Lautzenhiser | H03G 3/3036 |
| 2011/0006846 | A1 | 1/2011 | Miho | |
| 2014/0118074 | A1* | 5/2014 | Levesque | H03F 1/305 |
| | | | | 330/296 |
| 2014/0253243 | A1 | 9/2014 | Hagisawa | |
| 2015/0171796 | A1* | 6/2015 | Matsui | H03F 3/211 |
| | | | | 330/296 |
| 2016/0197586 | A1* | 7/2016 | Ripley | H03F 1/22 |
| | | | | 330/296 |

FOREIGN PATENT DOCUMENTS

| | | |
|---|---|---|
| JP | 2014-171170 A | 9/2014 |
| WO | 2009/125555 A1 | 10/2009 |

* cited by examiner

*Primary Examiner* — Khanh V Nguyen
(74) *Attorney, Agent, or Firm* — Pearne & Gordon LLP

(57) ABSTRACT

A power amplifier circuit includes a first transistor having a base to which a radio frequency (RF) signal is supplied and a collector to which a variable power-supply voltage corresponding to a level of the RF signal is supplied, and being configured to amplify the RF signal; a bias circuit including a second transistor configured to supply a bias current to the base of the first transistor; and an adjustment circuit configured to cause the bias current to be supplied to the base of the first transistor to decrease with decrease in the variable power-supply voltage by causing a current to be supplied to a base of the second transistor to decrease.

4 Claims, 6 Drawing Sheets

POWER AMPLIFIER CIRCUIT

This application claims priority from Japanese Patent Application No. 2017-217476 filed on Nov. 10, 2017. The content of this application is incorporated herein by reference in its entirety.

BACKGROUND OF THE DISCLOSURE

1. Field of the Disclosure

The present disclosure relates to a power amplifier circuit.

2. Description of the Related Art

In mobile communication terminals, such as cellular phones, a power amplifier circuit is used that amplifies a radio frequency (RF) signal to be transmitted to a base station. The power amplifier circuit includes a transistor that amplifies the RF signal, and a bias circuit that supplies a bias current to the transistor. For example, as disclosed in Japanese Unexamined Patent Application Publication No. 2014-171170, there is a power amplifier circuit including, as this type of bias circuit, an emitter follower transistor configured to supply a bias current to a transistor, and a constant voltage generation circuit configured to generate a constant voltage to be supplied to a collector of the emitter follower transistor.

Furthermore, there is envelope tracking (ET) control in which a power-supply voltage is controlled in accordance with an RF signal level to improve the efficiency of the power amplifier circuit. In the ET control, a power-supply voltage value is controlled in accordance with an RF signal level so that efficiency, such as power added efficiency (PAE), is increased. At this time, the larger the magnitude of a change in gain (gain dispersion) as a function of a change in power-supply voltage supplied to the transistor is, the higher the efficiency is, and a power-supply voltage value can be employed that achieves the high efficiency while maintaining the flatness of gain. Thus, in the ET control, it is desirable that the gain dispersion of the power amplifier circuit is large.

BRIEF SUMMARY OF THE DISCLOSURE

Preferred embodiments of the present disclosure provide a power amplifier circuit in which gain dispersion is widened in accordance with a change in power-supply voltage.

A power amplifier circuit according to one preferred embodiment of the present disclosure includes a first transistor having a base to which a radio frequency (RF) signal is supplied and a collector to which a variable power-supply voltage corresponding to a level of the RF signal is supplied, and being configured to amplify the RF signal; a bias circuit including a second transistor configured to supply a bias current to the base of the first transistor; and an adjustment circuit configured to cause the bias current to be supplied to the base of the first transistor to decrease with decrease in the variable power-supply voltage by causing a current to be supplied to a base of the second transistor to decrease.

Preferred embodiments of the present disclosure may provide a power amplifier circuit in which gain dispersion is widened in accordance with a change in power-supply voltage.

Other features, elements, characteristics and advantages of the present disclosure will become more apparent from the following detailed description of preferred embodiments of the present disclosure with reference to the attached drawings.

DETAILED DESCRIPTION OF THE DISCLOSURE

Figure 1:
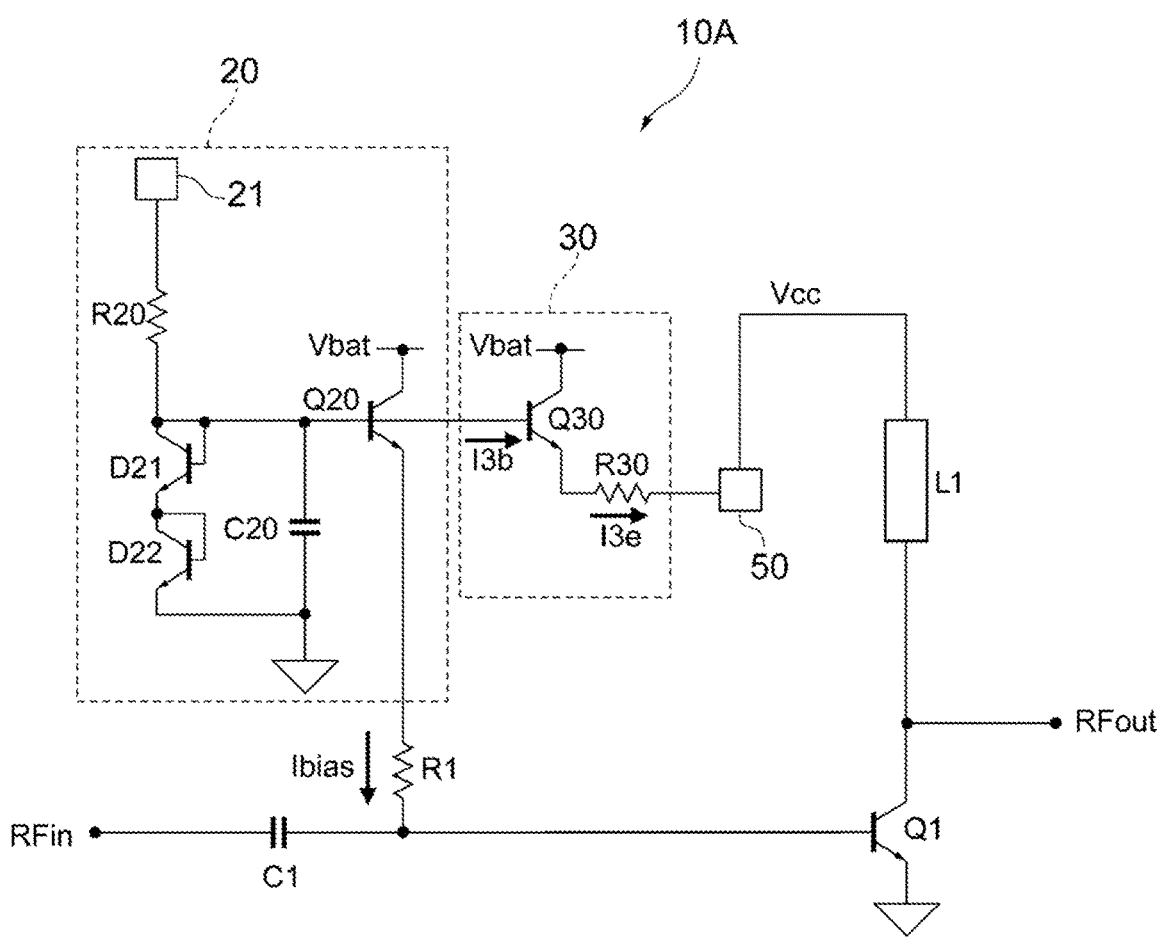
FIG. 1 is a circuit diagram of a power amplifier circuit according to a first embodiment of the present disclosure.

Preferred embodiments of the present disclosure will be described with reference to the accompanying drawings. In figures, elements denoted by the same reference numerals have the same or similar configuration.

First Embodiment

FIG. 1 is a circuit diagram of a power amplifier circuit 10A according to a first embodiment of the present disclosure. In a mobile communication terminal, such as a cellular phone, the power amplifier circuit 10A amplifies the power of an input signal RFin to a level necessary to transmit the input signal RFin to a base station and outputs this input signal RFin as an amplified signal RFout. The input signal RFin is a radio frequency (RF) signal modulated by, for example, a radio frequency integrated circuit (RFIC) or the like in accordance with a certain communication scheme.

The power amplifier circuit 10A includes a transistor Q1 (first transistor), a bias circuit 20, a bias adjustment circuit 30, a choke inductor L1, a capacitance element C1, and a resistance element R1. The transistor Q1 is a heterojunction bipolar transistor, for example. The transistor Q1 constitutes a common-emitter amplifier whose emitter is grounded, an input signal RFin is supplied to a base of the transistor Q1 through the capacitance element C1, and an amplified signal RFout is outputted from a collector of the transistor Q1. A terminal 50 for supply of a variable power-supply voltage Vcc is connected to the collector of the transistor Q1 through the choke inductor L1 that prevents leakage of the RF signal to a power-supply side. The variable power-supply voltage Vcc, which is not illustrated, is connected to the terminal 50. The variable power-supply voltage Vcc is a voltage corresponding to an amplitude level of the RF signal. That is, in the power amplifier circuit 10A, envelope tracking (ET) control is performed. The variable power-supply voltage Vcc is supplied from an ET power-supply circuit (not illustrated), for example.

The bias circuit 20 supplies a bias current Ibias to the base of the transistor Q1 through the resistance element R1. The bias circuit 20 includes a transistor Q20 (second transistor), and diodes D21 and D22. A power-supply voltage Vbat is supplied to a collector of the transistor Q20. A base of the transistor Q20 is connected to an anode of the diode D21 and is also connected to a ground through a capacitance element C20. An emitter of the transistor Q20 is connected to the base of the transistor Q1 through the resistance element R1. The anode of the diode D21 is connected to a power-supply terminal 21 through a resistance element R20. A bias control voltage or bias control current is supplied to the power-supply terminal 21 from a control IC or the like. An anode of the diode D22 is connected to a cathode of the diode D21. A cathode of the diode D22 is connected to the ground. Each of the diodes D21 and D22 is a diode-connected bipolar transistor, for example. Note that each of the diodes D21 and D22 is not limited to a diode-connected bipolar transistor and may be a PN junction diode, for example.

The bias adjustment circuit 30 adjusts the bias current Ibias to be supplied to the base of the transistor Q1 in accordance with the variable power-supply voltage Vcc. Specifically, the bias adjustment circuit 30 causes the bias current Ibias to decrease with decrease in the variable power-supply voltage Vcc. The bias adjustment circuit 30 includes a transistor Q30 (third transistor) and a resistance element R30. The power-supply voltage Vbat is supplied to a collector of the transistor Q30. A base of the transistor Q30 is connected to the base of the transistor Q20 included in the above-described bias circuit 20. One end of the resistance element R30 is connected to an emitter of the transistor Q30. The other end of the resistance element R30 is connected to the variable power-supply voltage Vcc through the terminal 50. Thus, a voltage corresponding to the variable power-supply voltage Vcc is supplied to the other end of the resistance element R30. The other end of the resistance element R30 does not have to be connected to the terminal 50 as long as a voltage corresponding to the variable power-supply voltage Vcc is supplied to the other end. For example, the other end of the resistance element R30 may be connected to the collector of the transistor Q1 through a low pass filter circuit or the like.

Next, the operation of the power amplifier circuit 10A will be described. As the variable power-supply voltage Vcc decreases, a voltage at the emitter of the transistor Q30 decreases through the terminal 50, and a base-emitter voltage of the transistor Q30 also rises. Then, when the base-emitter voltage of the transistor Q30 reaches an intended voltage, the transistor Q30 is turned ON, a current I3b thereby flows into the base of the transistor Q30, and a current I3e flows out of the emitter of the transistor Q30. Thus, as the current I3b, a part of a current having flowed into the base of the transistor Q20 flows into the base of the transistor Q30. When the variable power-supply voltage Vcc further decreases, the current I3b that flows into the base of the transistor Q30 increases, and thus the current that flows into the base of the transistor Q20 relatively decreases. Then, the bias current Ibias that flows out of the emitter of the transistor Q20 and is supplied to the base of the transistor Q1 decreases, and the gain of the transistor Q1 thus decreases.

Figure 2:
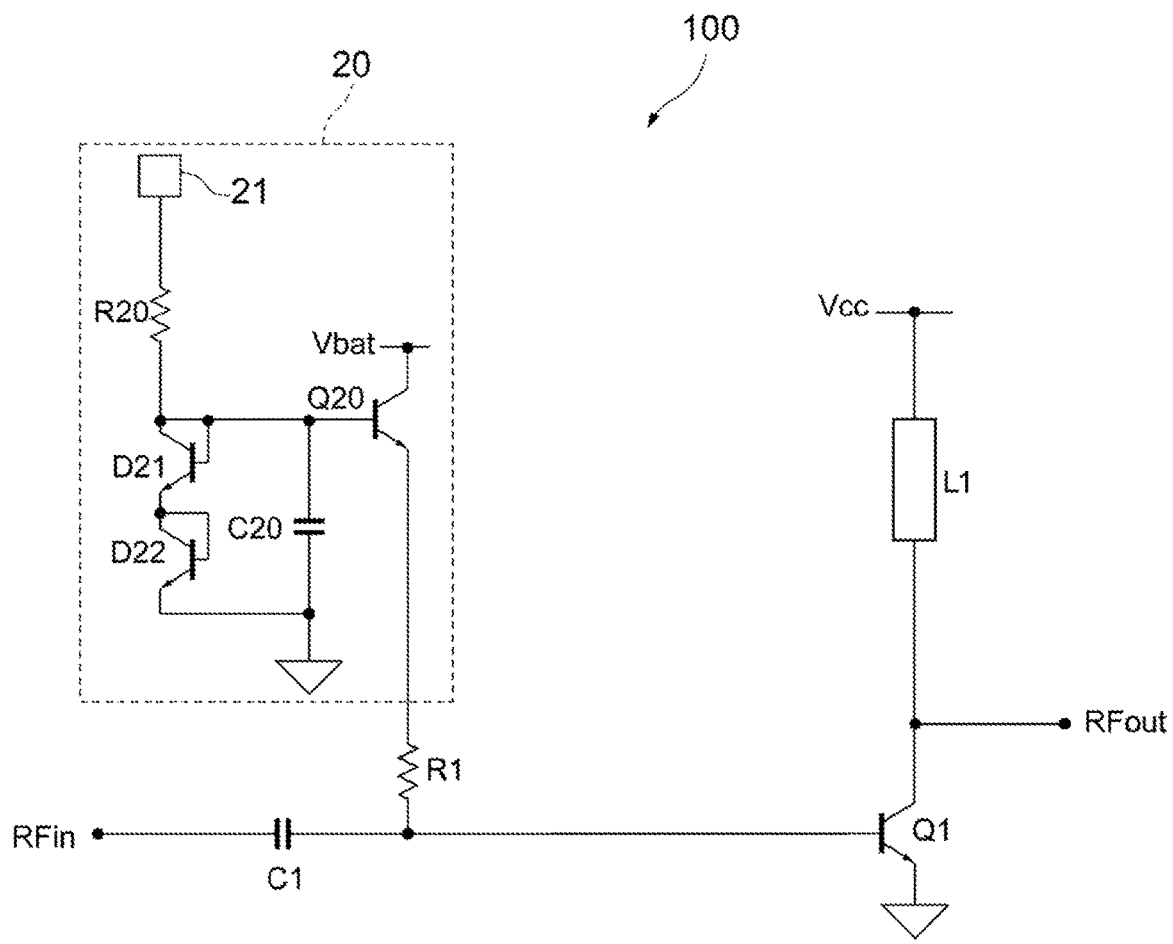
FIG. 2 is a circuit diagram of a power amplifier circuit of a comparative example.

FIG. 2 is a circuit diagram of a power amplifier circuit 100 of a comparative example. The power amplifier circuit 100 of the comparative example differs from the power amplifier circuit 10A according to the first embodiment in that the power amplifier circuit 100 does not include the bias adjustment circuit 30. The power amplifier circuit 100 of the comparative example does not include the bias adjustment circuit 30, and the bias current Ibias to be supplied to the base of the transistor Q1 is thus not adjusted in accordance with the variable power-supply voltage Vcc.

Figure 3:
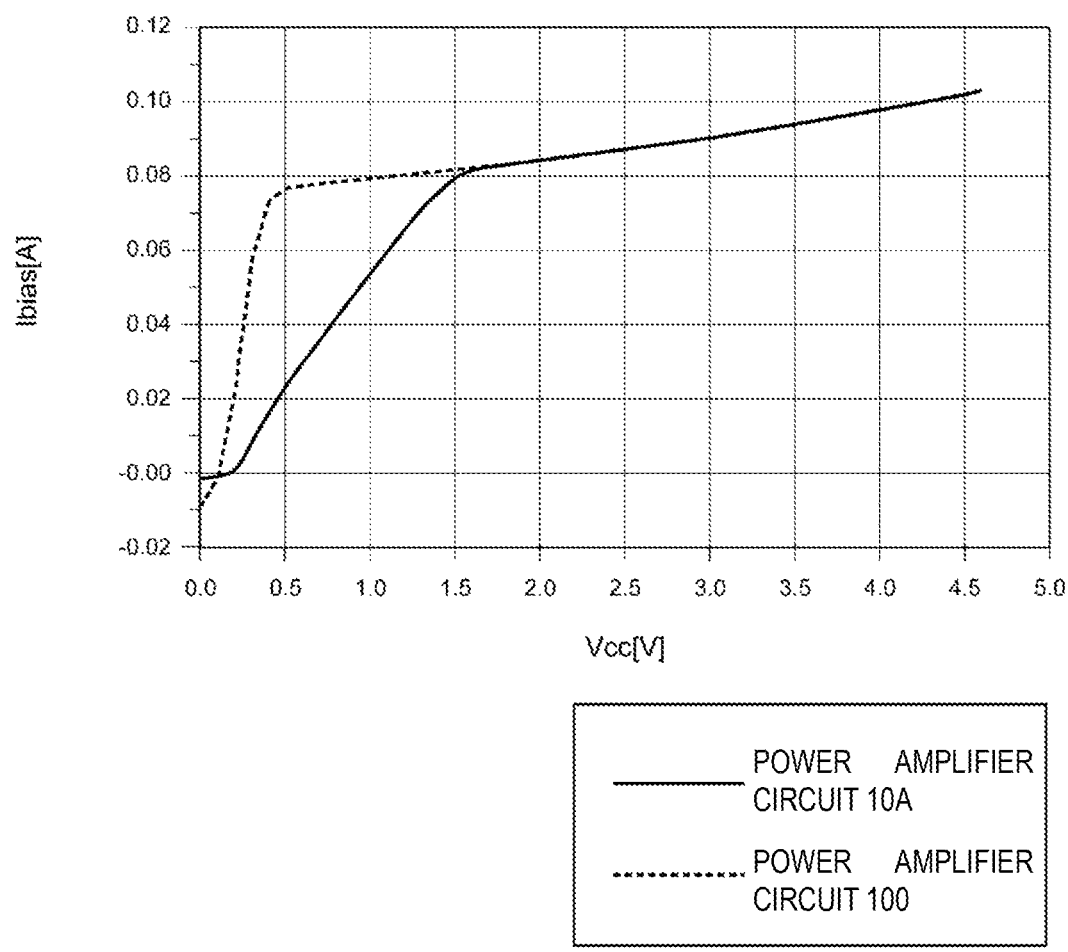
FIG. 3 illustrates the simulation results of a bias current.

FIG. 3 illustrates the simulation results of the bias current Ibias. In FIG. 3, the horizontal axis represents the variable power-supply voltage Vcc (V), and the vertical axis represents the bias current Ibias (A). In FIG. 3, a solid line represents a simulation result of the bias current Ibias of the power amplifier circuit 10A according to the first embodiment, and a dashed line represents a simulation result of the bias current Ibias of the power amplifier circuit 100 of the comparative example.

As illustrated in FIG. 3, in the power amplifier circuit 100 of the comparative example, it is found that a decrease in the bias current Ibias is small until the variable power-supply voltage Vcc decreases to about 0.4 V. This is because it is conceivable that the bias current Ibias decreases at an almost constant rate with decrease in the variable power-supply voltage Vcc because the power amplifier circuit 100 of the comparative example does not include the bias adjustment circuit 30. On the other hand, as illustrated in FIG. 3, in the power amplifier circuit 10A according to the first embodiment, although a decrease in the bias current Ibias is small until the variable power-supply voltage Vcc decreases to about 1.5 V, it is found that the bias current Ibias decreases rapidly when the variable power-supply voltage Vcc becomes less than about 1.5 V. This is because, as described above, it is conceivable that the bias current Ibias that flows out of the emitter of the transistor Q20 decreases because the current I3b flows into the base of the transistor Q30 of the bias adjustment circuit 30 when the variable power-supply voltage Vcc is not more than about 1.5 V. From the above, it may be said that the power amplifier circuit 10A according to the first embodiment causes the bias current Ibias to decrease more greatly than the power amplifier circuit 100 of the comparative example when the variable power-supply voltage Vcc decreases.

Figure 4A:
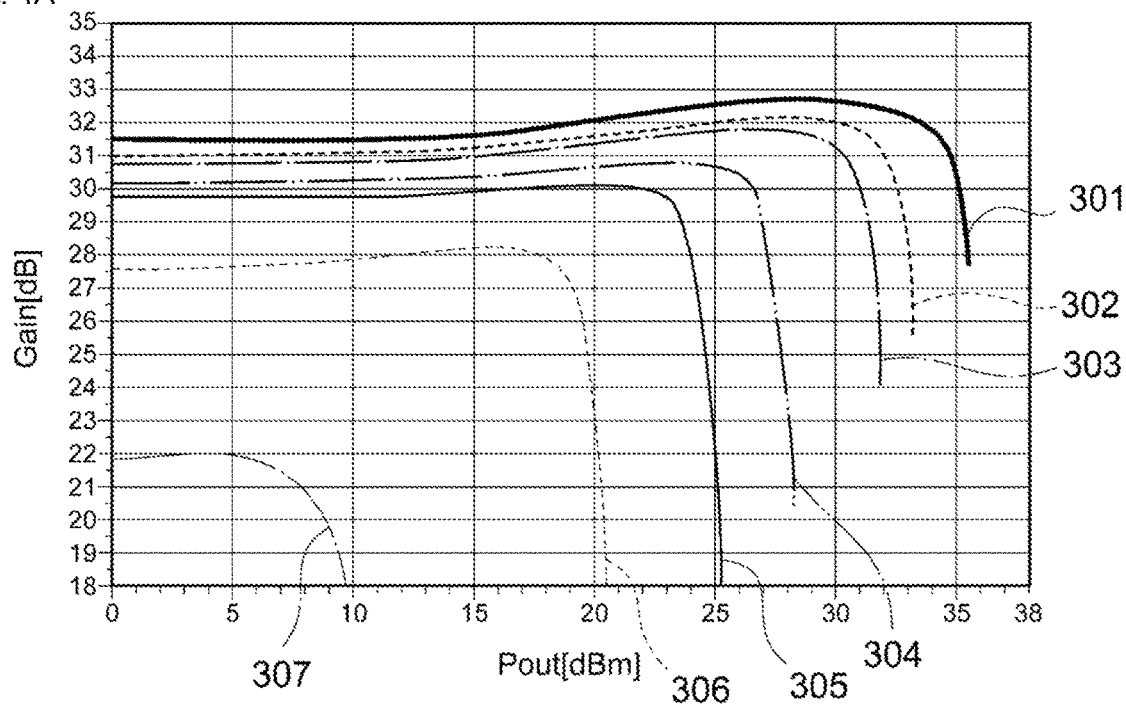
FIG. 4A illustrates the relationships between output power and gain in the power amplifier circuit according to the first embodiment.
Figure 4B:
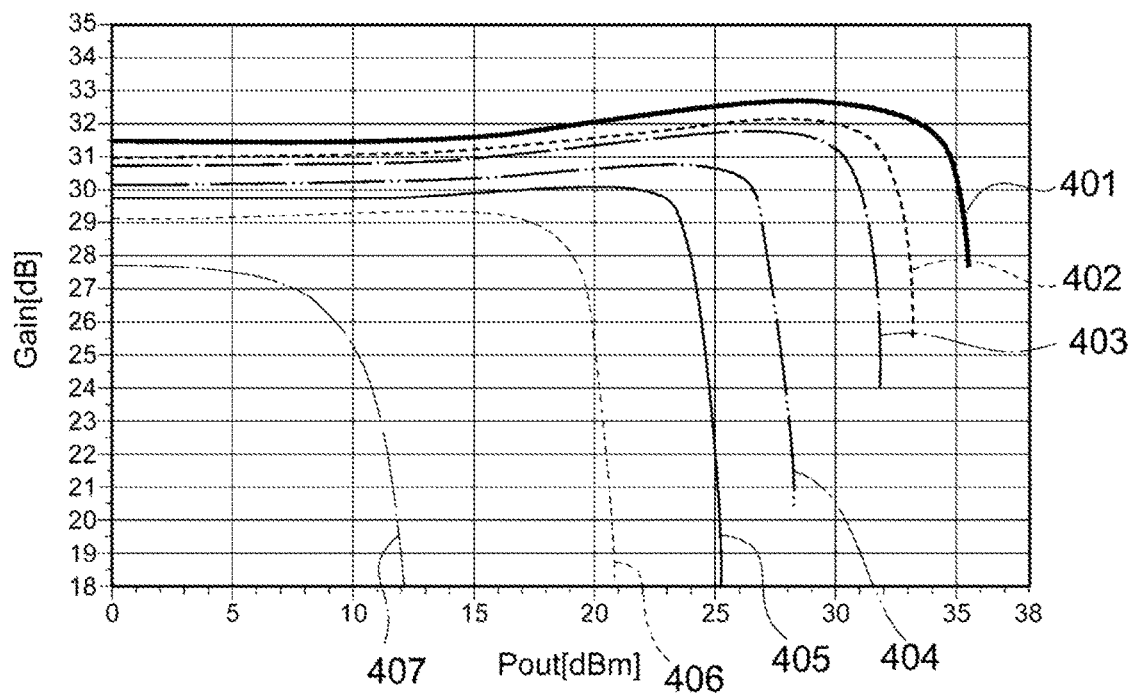
FIG. 4B illustrates the relationships between output power and gain in the power amplifier circuit of the comparative example, and illustrates the simulation results of gain.

FIG. 4A illustrates the relationships between output power and gain in the power amplifier circuit 10A according to the first embodiment. FIG. 4B illustrates the relationships between output power and gain in the power amplifier circuit 100 of the comparative example. In FIGS. 4A and 4B, the horizontal axis represents output power Pout (dBm), and the vertical axis represents gain (dB). In FIG. 4A, reference numerals 301, 302, 303, 304, 305, 306, and 307 respectively represent the relationships between output power and gain at variable power-supply voltages Vcc of about 4.5 V, about 3.5 V, about 3.0 V, about 2.0 V, about 1.5 V, about 1.0 V, and about 0.5 V. In FIG. 4B, reference numerals 401, 402, 403, 404, 405, 406, and 407 respectively represent the relationships between output power and gain at variable power-supply voltages Vcc of about 4.5 V, about 3.5 V, about 3.0 V, about 2.0 V, about 1.5 V, about 1.0 V, and about 0.5 V.

As illustrated in FIG. 4A, with respect to the power amplifier circuit 10A, at an output power of about 0 dBm, a gain at a variable power-supply voltage Vcc of about 4.5 V represented by 301 is about 31.4 dB, and a gain at a variable power-supply voltage Vcc of about 0.5 V represented by 307 is about 21.9 dB. Hence, with respect to the power amplifier circuit 10A, at the output power of about 0 dBm, when the variable power-supply voltage Vcc changes from about 4.5 V to about 0.5 V, a change in gain is about 9.5 dB (31.4 dB-21.9 dB). Furthermore, as illustrated in FIG. 4B, with respect to the power amplifier circuit 100, at an output power of about 0 dBm, a gain at a variable power-supply voltage Vcc of about 4.5 V represented by 401 is about 31.4 dB, and a gain at a variable power-supply voltage Vcc of about 0.5 V represented by 407 is about 27.7 dB. Hence, with respect to the power amplifier circuit 100, at the output power of about 0 dBm, when the variable power-supply voltage Vcc changes from about 4.5 V to about 0.5 V, a change in gain is about 3.7 dB (31.4 dB-27.7 dB). From the above, a change in gain as a function of a change in the variable power-supply voltage Vcc in the power amplifier circuit 10A is larger than a change in gain as a function of a change in the variable power-supply voltage Vcc in the power amplifier circuit 100. That is, it may be said that the power amplifier circuit 10A is wider in gain dispersion than the power amplifier circuit 100.

Second Embodiment

Figure 5:
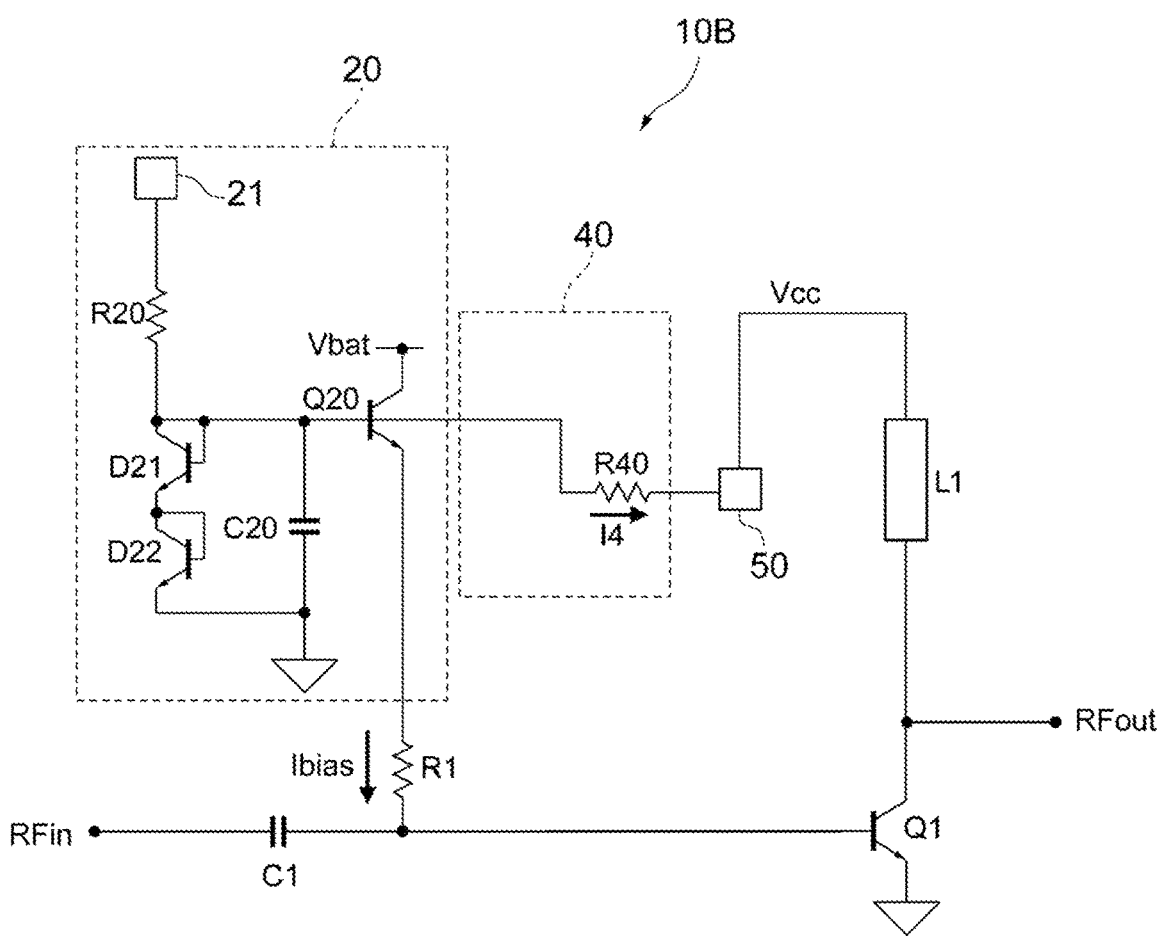
FIG. 5 is a circuit diagram of a power amplifier circuit according to a second embodiment of the present disclosure.

FIG. 5 is a circuit diagram of a power amplifier circuit 10B according to a second embodiment of the present disclosure. Hereinafter, among elements of the power amplifier circuit 10B, elements that differ from those of the power amplifier circuit 10A will be described, and description of elements that are the same as those of the power amplifier circuit 10A is appropriately omitted.

The power amplifier circuit 10B includes a bias adjustment circuit 40 that differs from the bias adjustment circuit 30 included in the power amplifier circuit 10A. The bias adjustment circuit 40 adjusts the bias current Ibias to be supplied to the base of the transistor Q1 in accordance with the variable power-supply voltage Vcc. Specifically, the bias adjustment circuit 40 causes the bias current Ibias to decrease with decrease in the variable power-supply voltage Vcc. The bias adjustment circuit 40 includes a resistance element R40. One end of the resistance element R40 is connected to the base of the transistor Q20 included in the bias circuit 20, and the other end of the resistance element R40 is connected to the variable power-supply voltage Vcc through the terminal 50. Thus, a voltage corresponding to the variable power-supply voltage Vcc is supplied to the other end of the resistance element R40.

Next, the operation of the power amplifier circuit 10B will be described. A current flows into the base of the transistor Q20 from the power-supply terminal 21 through the resistance element R20. Furthermore, when the variable power-supply voltage Vcc is sufficiently large, a current also flows into the base of the transistor Q20 from the variable power-supply voltage Vcc through the terminal 50 and the resistance element R40. When a voltage at the other end of the resistance element R40 decreases through the terminal 50 as the variable power-supply voltage Vcc decreases, the current that flows into the base of the transistor Q20 through the terminal 50 and the resistance element R40 decreases. Before long, when the variable power-supply voltage Vcc decreases to an intended voltage, the current that flows into the base of the transistor Q20 through the terminal 50 and the resistance element R40 reaches 0. When the variable power-supply voltage Vcc further decreases, a part of the current having flowed into the base of the transistor Q20 from the power-supply terminal 21 through the resistance element R20 starts to flow to the resistance element R40. Subsequently, as the variable power-supply voltage Vcc decreases, the current that is drawn from the base of the transistor Q20 to a resistance element R40 side increases. From the above, as the variable power-supply voltage Vcc decreases, the current that flows into the base of the transistor Q20 relatively decreases. Hence, the bias current Ibias that flows out of the emitter of the transistor Q20 and is inputted to the base of the transistor Q1 decreases, and the gain of the transistor Q1 thus decreases.

Figure 6:
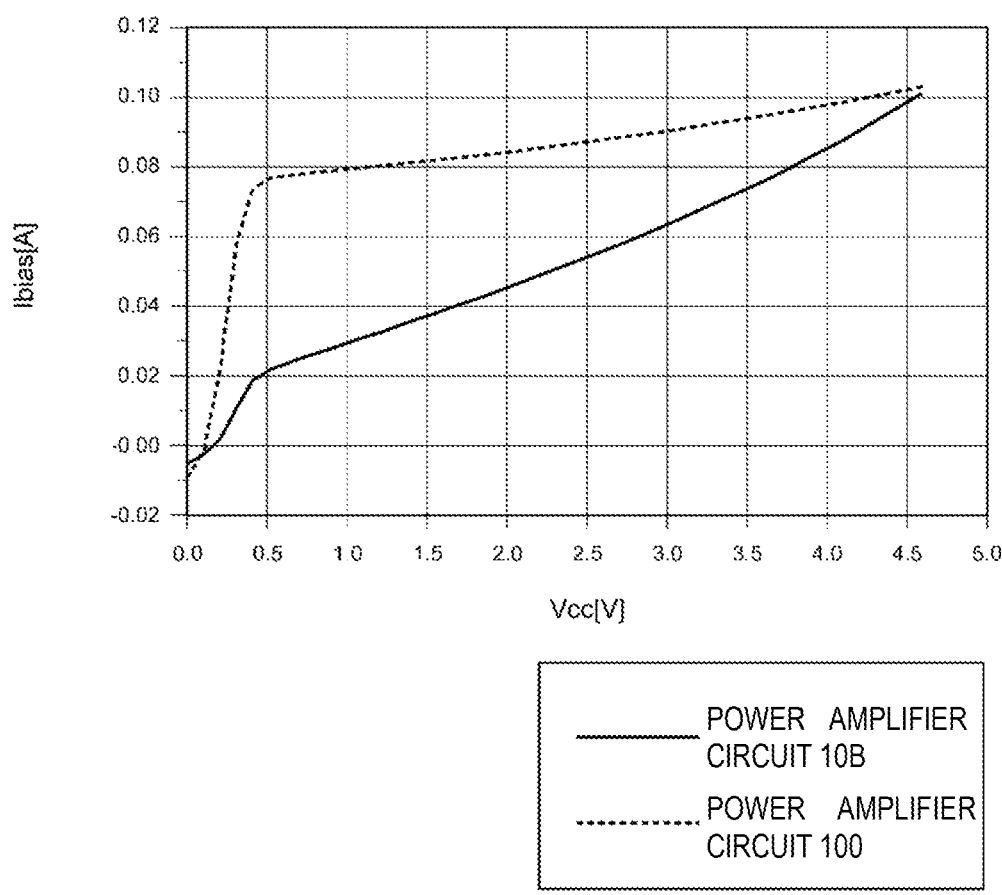
FIG. 6 illustrates the simulation results of the bias current.

FIG. 6 illustrates the simulation results of the bias current Ibias. In FIG. 6, the horizontal axis represents the variable power-supply voltage Vcc (V), and the vertical axis represents the bias current Ibias (A). In FIG. 6, a solid line represents a simulation result of the bias current Ibias of the power amplifier circuit 10B according to the second embodiment, and a dashed line represents a simulation result of the bias current Ibias of the power amplifier circuit 100 of the comparative example.

As illustrated in FIG. 6, in the power amplifier circuit 100 of the comparative example, it is found that a decrease in the bias current Ibias is small until the variable power-supply voltage Vcc decreases to about 0.4 V. This is because it is conceivable that the bias current Ibias decreases at an almost constant rate with decrease in the variable power-supply voltage Vcc because the power amplifier circuit 100 of the comparative example does not include the bias adjustment circuit 30. On the other hand, as illustrated in FIG. 6, in the power amplifier circuit 10B according to the second embodiment, it is found that a decrease in the bias current Ibias increases above a decrease in that in the power amplifier circuit 100 of the comparative example as the variable power-supply voltage Vcc decreases from about 4.5 V to about 0.4 V. This is because, as described above, it is conceivable that the current that flows into the base of the transistor Q20 relatively decreases because a current I4 that flows into the resistance element R40 increases as the variable power-supply voltage Vcc decreases. From the above, it may be said that the power amplifier circuit 10B according to the second embodiment causes the bias current Ibias to decrease more greatly than the power amplifier circuit 100 of the comparative example when the variable power-supply voltage Vcc decreases.

The exemplary embodiments of the present disclosure have been described above. Both of the power amplifier circuit 10A and the power amplifier circuit 10B may be used for, of an amplifier module having a two-stage configuration including a driver-stage amplifier and a power-stage amplifier, only the driver-stage amplifier, only the power-stage amplifier, or both of the driver-stage amplifier and the power-stage amplifier. The case of the use for both of the driver-stage amplifier and the power-stage amplifier enhances the effects of gain dispersion in comparison with the case of the use for only the driver-stage amplifier or only the power-stage amplifier. Furthermore, both of the power amplifier circuit 10A and the power amplifier circuit 10B may be used for, of an amplifier module including three or more stages of amplifiers, at least one amplifier.

As described in the first embodiment, the power amplifier circuit 10A includes the first transistor Q1 having the base to which the RF signal is supplied and the collector to which the variable power-supply voltage Vcc corresponding to a level of the RF signal is supplied, and being configured to amplify the RF signal; the bias circuit 20 including the second transistor Q20 configured to supply the bias current Ibias to the base of the first transistor Q1; and the bias adjustment circuit 30 configured to cause the bias current Ibias to be supplied to the base of the first transistor Q1 to decrease with decrease in the variable power-supply voltage Vcc by causing a current to be supplied to the base of the second transistor Q20 to decrease. Thus, when the variable power-supply voltage Vcc decreases, the current that flows into the base of the second transistor Q20 decreases. Then, the bias current Ibias that flows out of the emitter of the second transistor Q20 and is supplied to the base of the first transistor Q1 decreases, and the gain of the first transistor Q1 thus decreases. From the above, the gain dispersion of the power amplifier circuit 10A is widened.

Furthermore, in the power amplifier circuit 10A, the bias adjustment circuit 30 includes the third transistor Q30 having the base connected to the base of the second transistor Q20 and the emitter to which a voltage corresponding to the variable power-supply voltage Vcc is supplied. Thus, when the variable power-supply voltage Vcc decreases to an intended voltage, the third transistor Q30 is turned ON, the current I3b flows into the base of the third transistor Q30, and the current I3e flows out of the emitter of the third transistor Q30. Then, as the variable power-supply voltage Vcc decreases from the intended voltage, a voltage at the emitter of the third transistor Q30 decreases, the current I3e that flows out of the emitter of the third transistor Q30 increases, and thus the current I3b that flows into the base of the third transistor Q30 also increases. As a result of this, a part of the current having flowed into the base of the second transistor Q20 flows into the base of the third transistor Q30, and the bias current Ibias that flows out of the emitter of the second transistor Q20 and is supplied to the base of the first transistor Q1 thus decreases.

Furthermore, in the power amplifier circuit 10A, the bias adjustment circuit 30 further includes the resistance element R30 whose one end is connected to the emitter of the third transistor Q30 and whose other end is subjected to supply of the voltage corresponding to the variable power-supply voltage Vcc. This enables adjustment of the value of the intended voltage at which the third transistor Q30 is turned ON.

Furthermore, as described in the second embodiment, in the power amplifier circuit 10B, the bias adjustment circuit 40 includes the resistance element R40 whose one end is connected to the base of the second transistor Q20 and whose other end is subjected to supply of a voltage corresponding to the variable power-supply voltage Vcc. Thus, as the variable power-supply voltage Vcc decreases, a voltage at the other end of the resistance element R40 decreases. Then, the current I4 that flows to the resistance element R40 increases. As a result of this, a part of the current having flowed into the base of the second transistor Q20 flows into the resistance element R40 side, and the current that flows into the base of the second transistor Q20 thus decreases. Then, the bias current Ibias that flows out of the emitter of the second transistor Q20 and is supplied to the base of the first transistor Q1 decreases, and the gain of the first transistor Q1 thus decreases. From the above, the gain dispersion of the power amplifier circuit 10B is widened.

The above-described embodiments are intended to facilitate understanding of the present disclosure, but are not intended for a limited interpretation of the present disclosure. The elements included in the embodiments, and the arrangements, materials, conditions, shapes, sizes, and the like of the elements are not limited to those exemplified in the embodiments, and can be appropriately changed. Furthermore, configurations described in different embodiments can be partially replaced or combined with each other.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier circuit comprising:
    a first transistor having a base to which a radio frequency (RF) signal is supplied and a collector to which a variable power-supply voltage supplied, wherein the variable power-supply voltage corresponds to a level of the RF signal and the first transistor is configured to amplify the RF signal;
    a bias circuit comprising a second transistor configured to supply a bias current to the base of the first transistor; and
    an adjustment circuit configured to cause the bias current to decrease as the variable power-supply voltage decreases by causing a current supplied to a base of the second transistor to decrease.

2. The power amplifier circuit according to claim 1, wherein the adjustment circuit comprises a third transistor having a base connected to the base of the second transistor and an emitter supplied with a voltage corresponding to the variable power-supply voltage.

3. The power amplifier circuit according to claim 2, wherein the adjustment circuit further comprises a resistance element connected between the emitter of the third transistor and the variable power-supply voltage.

4. The power amplifier circuit according to claim 1, wherein the adjustment circuit comprises a resistance element connected between the base of the second transistor and the variable power-supply voltage.

* * * * *